United States Patent
Perner et al.

(10) Patent No.: US 7,006,388 B2
(45) Date of Patent: Feb. 28, 2006

(54) MEMORY WITH REFERENCE-INITIATED SEQUENTIAL SENSING

(75) Inventors: Frederick A. Perner, Palo Alto, CA (US); Anthony Holden, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 51 days.

(21) Appl. No.: 10/650,278

(22) Filed: Aug. 28, 2003

(65) Prior Publication Data

US 2005/0047219 A1    Mar. 3, 2005

(51) Int. Cl.
*G11C 11/34* (2006.01)
(52) U.S. Cl. ................ 365/189.07; 365/196
(58) Field of Classification Search ........... 365/189.07, 365/196
See application file for complete search history.

(56) References Cited

U.S. PATENT DOCUMENTS

| 3,599,186 A | * | 8/1971 | May et al. ............ 712/205 |
| 6,188,615 B1 | | 2/2001 | Perner et al. |
| 6,836,431 B1 | * | 12/2004 | Chang .............. 365/185.03 |

* cited by examiner

*Primary Examiner*—Michael Tran

(57) ABSTRACT

Disclosed herein are systems and devices having memories with reference-initiated sequential sensing. In one embodiment, a reference-initiated sequential sensing method comprises: forming a first attribute measurement associated with a stored data value in a first memory element; using the first memory element to determine a decision threshold; comparing the first attribute measurement to the decision threshold to determine the stored data value in the first memory element; forming a subsequent attribute measurement associated with a stored data value in a subsequent memory element; and comparing the subsequent attribute value to the decision threshold to determine a data value stored in the subsequent memory element.

21 Claims, 3 Drawing Sheets

MEMORY WITH REFERENCE-INITIATED SEQUENTIAL SENSING

BACKGROUND

Many developing technologies have been embraced because they increase accessibility to information. Examples of such technologies include microfilm, magnetic tapes, magnetic disk media, optical disk media, and integrated memories. Integrated memories in particular offer a high degree of accessibility.

Integrated memories are electrical circuits that are configured to store information in digital form. This information, or "data," is readily accessible to any digital device appropriately coupled to the integrated memory. Depending on the particular technology employed, data can be accessed at truly astonishing rates.

Integrated memories are often classified as volatile or non-volatile. Volatile integrated memories suffer loss of stored data in the absence of electrical power, but this shortcoming may be offset by advantages in information density and access rates. Non-volatile memories retain their stored information in the absence of electrical power, but may suffer from a reduced information density, a reduced access rate, and/or a lack of programmability.

Magnetic random access memory (MRAM) offers programmability, non-volatility, high information density, and a moderate access rate. MRAMs, as that term is used herein, are integrated memories that use magnetic fields to store data. These magnetic fields can be embedded in magnetic materials that do not rely on the continued presence of electrical power to preserve the magnetic fields. A variety of sensing techniques may be employed to detect magnetic fields in these memories and to determine the data these fields represent.

In one type of MRAM, data is stored in an array of memory elements. Each of the memory elements may include two magnetic layers separated by an insulating layer. The magnetic orientations of the two layers may be aligned ("parallel") or opposed ("anti-parallel"). These parallel and anti-parallel conditions may cause the memory element to have different electrical resistances. The two resistance values may be associated with digital values (e.g., 0 and 1), allowing each memory element to store one binary digit ("bit") of information. The stored bit may be detected by measuring the resistance of the memory element, e.g., by measuring an electrical voltage or current when electrical energy is supplied to the memory element.

As part of the manufacturing process, variations may develop within an array of memory elements. Consequently, different memory elements may have different resistances when they represent a given digital value. The variation may be enough to prevent the use of a standard threshold value to distinguish between digital values. For example, if in each memory element the resistance associated with a digital 0 is higher than the resistance associated with a digital 1, any processing variation that significantly increases the resistance of some of the memory elements may cause their digital 1's to be mistaken for 0's when a low threshold value is used. Conversely, if a higher threshold value is used, the digital 0's in the other memory cells may be mistaken for 1's. The presence of electrical noise in the integrated memory will only exacerbate this problem.

Thus, improved methods for detecting data stored in MRAM cells are desirable.

BRIEF SUMMARY

Accordingly, there is disclosed herein systems and devices having memories with reference-initiated sequential sensing. In one embodiment, a reference-initiated sequential sensing method comprises: forming a first attribute measurement associated with a stored data value in a first memory element; using the first memory element to determine a decision threshold; comparing the first attribute measurement to the decision threshold to determine the stored data value in the first memory element; forming a subsequent attribute measurement associated with a stored data value in a subsequent memory element; and comparing the subsequent attribute value to the decision threshold to determine a data value stored in the subsequent memory element.

BRIEF DESCRIPTION OF THE DRAWINGS

For a detailed description of various invention embodiments, reference will now be made to the accompanying drawings in which.

NOTATION AND NOMENCLATURE

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to suggest that the scope of the disclosure, including the claims, is limited to that embodiment.

Figure 1:
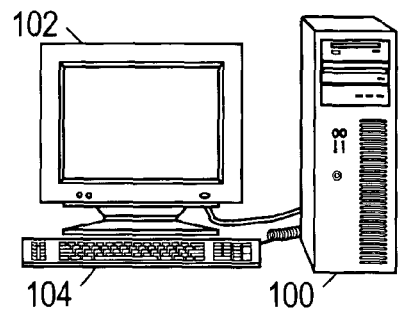
FIG. 1 is an external view of an exemplary digital system having a memory in accordance with various disclosed embodiments.

FIG. 1 shows a desktop computer as an exemplary digital device 100. To interact with a user, digital device 100 may be coupled to a text or graphical display 102, and to an input device 104. Display 102 and input device 104 may together operate as an interface between the user and digital device 100. That is, digital device 100 may perform certain actions prompted by user actuation of input device 104 and provide the user with a response via display 102. Digital device 100 may incorporate an integrated memory with computer instructions that determine the appropriate actions and/or responses to the user. Although digital device 100 is shown as a desktop computer, all other digital devices that may incorporate one or more integrated memories are contemplated, including (but not limited to): digital cameras, personal digital assistants, cellular phones, digital music players, digital multimedia systems, and digital system controllers.

Figure 2:
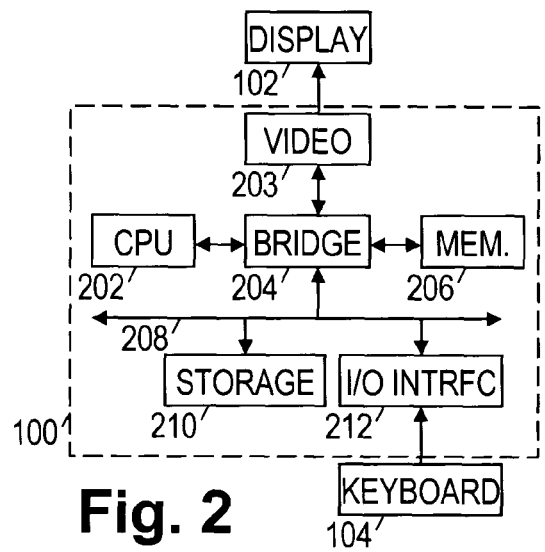
FIG. 2 is a block diagram of the digital system of FIG. 1.

FIG. 2 shows an example of a block diagram for digital device 100. Device 100 may include a central processing unit (CPU) 202 that is coupled by a bridge 204 to a system memory 206. CPU 202 may also be coupled by bridge 204 to a video card 203 that in turn couples to display 102. CPU 202 may be further coupled by bridge 204 to an expansion bus 208. Also coupled to the expansion bus 208 may be a storage device 210 and an input/output interface 212. Input device 104 may be coupled to device 100 via input/output interface 212.

CPU 202 may operate in accordance with software stored in memory 206 and/or storage device 210. Under the direction of the software, the CPU 202 may accept commands from an operator via a keyboard or some alternative input device 104, and may display desired information to the operator via display 102 or some alternative output device. CPU 202 may control the operations of other system components to retrieve, transfer, and store data.

Bridge 204 coordinates the flow of data between components. Bridge 204 may provide dedicated, high-bandwidth, point-to-point buses for CPU 202, memory 206, and video card 203. In digital devices that do not have high performance demands, the bridge 204 may be omitted and the communications between the CPU and all the other system components may occur via bus 208.

Memory 206 may store software and data for rapid access. Memory 206 may include integrated memory modules, one or more of which may be non-volatile.

Video card 203 may provide customized processing for graphics and data conversion from a memory-based format to a signal format suitable for display 102. Display 102 may provide data for use by an operator.

Expansion bus 208 may support communications between bridge 204 and multiple other computer components. Bus 208 may couple to removable modular components and/or components integrated onto a circuit board with bridge 204 (e.g., audio cards, network interfaces, data acquisition modules, modems).

Storage device 210 may store software and data for long-term preservation. Storage device 210 may be portable, or may accept removable media, or may be an installed component, or may be an integrated component on the circuit board. Storage device 210 may be a removable memory device such as a memory card. Alternatively, storage device 210 may be a nonvolatile integrated memory, a magnetic media storage device, an optical media storage device, or some other form of long-term information storage.

Input/output interface 212 may support communications with legacy components and devices not requiring a high-bandwidth connection. Input/output interface 212 may further include a real-time clock and may support communications with scan chains for low-level testing of the system.

Input device 104 may provide data to interface 212 in response to operator actuation. Input device 104 may be a keyboard or some other input device (e.g., pointing devices, buttons, sensors). Multiple input devices may be coupled to input/output interface 212 to provide data in response to operator actuation. Output devices (e.g., parallel ports, serial ports, printers, speakers, lights) may also be coupled to input/output interface 212 to communicate information to the operator.

Memory 206 and storage device 210 may be the primary data storage resources, and accordingly, they may include large amounts of integrated memory, possibly either in the form of relatively few large-capacity integrated memory devices, or in the form of a large number of relatively small-capacity integrated memory devices. However, other components of digital device 100 may also include integrated memory devices. For example, video card 203 may include one or more integrated memory devices for image storage and processing. Similarly, input/output interface 212 may include an integrated memory device for long-term storage of configuration parameters and basic input/output system (BIOS) routines.

Figure 3:
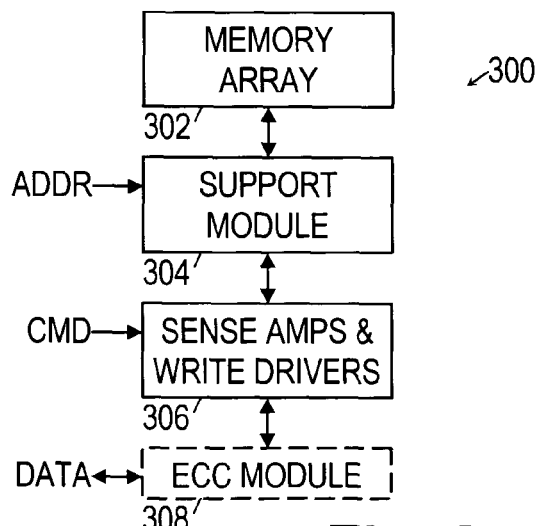
FIG. 3 is a high-level functional block diagram of a memory embodiment.

FIG. 3 shows an example of an integrated memory device 300. Device 300 may be an assisted memory device such as that disclosed in related U.S. patent application Ser. No. 10/384,053, filed Mar. 6, 2003, which is hereby incorporated herein by reference. An assisted memory device is a memory device that incorporates error correction techniques to cope with potential errors in storage or recovery of data. Such errors might be caused by (among other things) isolated manufacturing faults in memory cells, unpredictable inter-cell coupling faults, or transient signaling faults in the row and column lines during read end write operations.

Integrated memory device 300 includes a memory array 302, a support module 304, read and write module 306, and an error correction code (ECC) module 308. Memory array 302 includes a plurality of memory cells or memory elements each of which is capable of storing at least one bit of data. Memory array 302 may be of any programmable memory technology such as random access memory (RAM) or electrically programmable read-only memory (EPROM), including but not limited to dynamic RAM (DRAM), extended data out RAM (EDO RAM), video RAM (VRAM), static RAM (SRAM), synchronous DRAM (SDRAM), magnetoresistive or magnetic RAM (MRAM), and flash ROM. Although the following description is made primarily in the context of MRAM, the disclosed architecture and techniques are not so limited and are applicable to other memory storage technologies.

Each memory cell or element in array 302 is associated with a memory address, although each memory address may be associated with multiple memory cells. Support module 304 may receive an address signal and may responsively provide access to the associated memory cells in memory array 302. The access to selected memory cells is made via read and write module 306.

Read and write module 306 includes sense amplifiers to detect ("read") data values stored in the memory cells made accessible by support module 304. Module 306 may further include write drivers to store ("write") new data values in the memory cells. The operation of module 306 may be controlled by a command signal. The command signal may simply indicate when a read operation is desired and when a write operation is desired. When a write operation is indicated, the read and write module 306 may accept data from module 308 and store the data in the selected memory cells. Conversely, when a read operation is indicated, module 306 may retrieve data from the selected memory cells and provide the data to module 308. Note that the command signal may further indicate when memory device 300 is enabled or disabled, and may also indicate when configuration information is being provided to memory device 300.

Memory device 300 may include an ECC module 308 that is operable to detect and correct data errors arising in memory device 300. As data is received for storage, ECC module 308 encodes the data, converting data words into code words. By way of example, during a write operation an ECC module employing a (7,4,3) Hamming code may convert a four-bit data word into a seven-bit code word. The code word may then be stored in memory cells associated with the specified memory address. Conversely, during a read operation, a seven-bit word may be retrieved from memory cells associated with the specified memory address. The seven-bit word may be a code word, or it may contain a bit error. In either case, ECC module 308 may decode the seven-bit word, converting it into the appropriate four-bit data word, even if the retrieved seven-bit word contains an error. The data word may then be provided as output data.

Of course, other error correction codes may be used. Examples of suitable error correcting codes include: Hamming codes, Goppa codes, Golay codes, Reed-Solomon codes, and convolutional codes. The coding may be done on a per-word basis, as described above. Alternatively, or in addition, the coding may be done on groups of words, so as to be able to correct an erroneous word within the group. Although the ECC module may require significant processing time during the decode process, it is expected that pipelining techniques may be employed to sustain high throughput rates.

Figure 4:
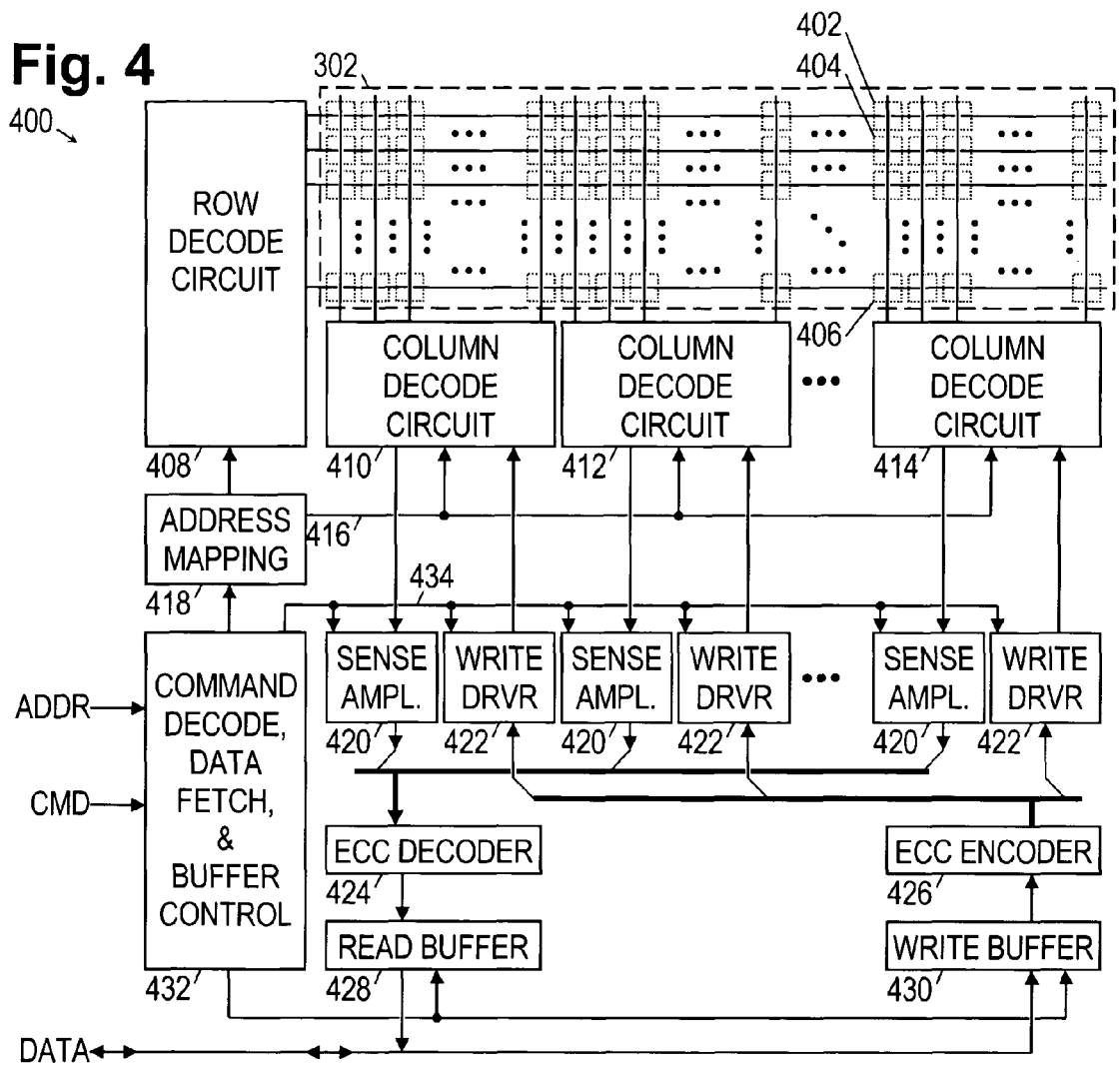
FIG. 4 is a more detailed functional block diagram of a memory embodiment.

FIG. 4 shows a more detailed block diagram of an integrated memory device 400. Memory device 400 includes a memory array 302; a support module that includes row decoder 408, column decoders 410, 412 and 414, and address mapping module 418; a read and write module that includes sense amplifiers 420 and write drivers 422; an optional ECC module that includes ECC decoder 424 and ECC encoder 426; and an optional buffered memory interface that may include a read buffer 428, a write buffer 430, and an interface control 432.

Memory array 302 is an array of memory elements. The memory elements may be magnetic memory storage elements. Each magnetic memory storage element may include a data storage layer and a reference layer, each of which have a magnetic orientation. The logic state of a magnetic memory element depends on the relative orientations of magnetization in its data storage and reference layers. Only two relative orientations are stable. These two stable orientations, parallel and anti-parallel, may represent logic values of "0" and "1."

The memory cells of array 302 are generally arranged in rows and columns, with the rows extending along one axis and the columns extending along a perpendicular axis. In FIG. 4, certain specifically labeled memory elements 402, 404 and 406 are arranged along a column. Only a relatively small number of memory cells are shown to aid in understanding. In practice, arrays may be of any size including an array of 1024×1024 memory cells or larger.

FIG. 4 shows row lines extending in a horizontal direction and column lines extending in a vertical direction. In one embodiment, there is one row line for each row of memory cells and one column line for each column of memory cells. Each memory cell is shown located at a crossing point of a corresponding row and column line. In one embodiment, a memory cell is made accessible when row decoder 408 asserts the corresponding row line, and one of the column decoders 410, 412, 414 couples the corresponding column line to a sense amplifier 420 or a write driver 422. During read operations, the resistance of a memory cell may be detected by a sense amplifier 420, and during a write operation, the magnetization state of the memory cell may be set by write driver 422.

Row decoder 408 may be operable to select a row line in response to a row address $A_R$, and the column decoders 410, 412, 414 may be operable to each select a column line in response to a column address $A_C$ 416. In response to the row address $A_R$, row decoder 408 may couple a corresponding row line to a known voltage level such as ground. In response to the column address $A_C$ 416, each column decoder 410, 412, 414 may couple a corresponding column line to a sense amplifier 420 and/or a write driver 422. A selected plurality of memory cells lie at the intersections of selected row and column lines.

The row addresses $A_R$ and the column addresses $A_C$ may be supplied to the row decoder and the column decoders, respectively, by address mapping module 418. In one embodiment, address mapping module 418 receives a memory address from interface control 432, and converts the received memory address to a physical address based an internal mapping method that may replace defective memory cells with "spare" memory cells in the array. Further details on various embodiments of address mapping module 418 may be found in commonly-assigned U.S. patent application Ser. No. 10/044,542, filed on Jan. 11, 2002, and entitled Self-Healing MRAM, and U.S. patent application Ser. No. 09/766,354, filed on Jan. 19, 2001, and entitled Self-Healing Memory, both incorporated herein by reference. Row decoder 408 and column decoders 410, 412, 414 may use the physical addresses provided by mapping module 418 to select memory cells associated with the memory address.

Write drivers 422 may operate in parallel to set the logical states of the selected memory cells. The logical states may be bits of a code word provided by ECC encoder 426 in response to a data word. The code word is preferably designed to provide redundancy, i.e., additional information to aid in the determination of the correct data word when errors are encountered.

Sense amplifiers 420 may operate in parallel to detect the logical states of the selected memory cells. ECC decoder 424 may combine the data from sense amplifiers 420 to form a code word (with or without errors), and may process the code word to extract an error-free data word. Ideally, the ECC decoder may operate to correct transient errors, whereas the address mapping module 418 may operate to prevent errors caused by permanent defects in memory cells.

A number of ECC decoder implementations may exist, ranging from fast combinatorial logic to sequential state-machine based implementations. The Hamming code, Reed-Solomon codes, binary Golay code, binary Goppa code, Viterbi code or other algorithms may be used to generate the ECC code words based on a block of data of a predetermined size. Extended error correction capability and data efficiency can be achieved with larger data block sizes, more powerful ECC algorithms, but greater circuit complexity. Such added complexity need not be insurmountable if a buffered memory interface is used.

Memory device 400 may include a buffered memory interface in the form of one or more read buffers 428, a write buffer 430, and an interface control 432. The one or more read buffers 428 may operate under the control of interface control 432 to accept data from ECC decoder 424, and to provide outgoing data on the bi-directional data bus. Write buffer 430 may buffer incoming data from the bi-directional data bus, and provide the data to ECC encoder 426.

In one embodiment, interface control 432 accepts a command signal that indicates read and write commands, and further accepts an address signal that indicates memory addresses associated with the read and write commands. In response to one or more read/write commands, interface control 432 generates a sequence of read/write operations on memory array 302 to satisfy the commands, but also to prepare the one or more read buffers 428 in anticipation of future commands. If a read command is received for an address whose data has already been retrieved into a read buffer 428 (or whose data still remains in optional write buffer 430), the interface control 432 may causes the buffer to satisfy the command with little or no latency.

As interface control 432 receives a read command for an address whose data is not currently buffered, interface control 432 may initiate a sequence of read operations on memory array 302 for the requested address and a block of neighboring addresses. In one embodiment, the interface control 432 reads at least one sector into the read buffer in response to a read command for unbuffered data. A sector may be as little as two bytes, or may be fairly large (e.g. 4 kilobytes).

In the foregoing, two memory embodiments have been discussed to aid in the understanding of a reference-initiated sequential sensing technique. In the first memory embodiment (that of FIG. 3), the sensing technique may be carried out by the interaction of support module 304 and read/write module 306. Memory device 300 may have only a single sense amplifier which detects stored data bytes by reading sequentially along a column or row. In the second memory embodiment (that of FIG. 4), the sensing technique may be implemented by interface control 432, which causes a bank of sense amplifiers to operate in parallel to read words in a sequence of data (i.e., a sector). For an example of a suitable sense amplifier for implementing this technique, refer to U.S. Pat. No. 6,188,615 ("MRAM Device Including Digital Sense Amplifiers"), which is hereby incorporated by reference.

In FIG. 4, memory array 302 is shown having multiple memory elements 402, 404, 406 arranged along a column. Under the guidance of interface control 432, the row and column decoders cooperate to make a sequence of memory elements accessible to the sense amplifiers 420 and write drivers 422. By way of example, row decoder 408 and column decoder 414 may sequentially couple memory elements in a column to sense amplifier 420, starting with memory elements 402 and 404, and eventually reaching memory element 406.

In one embodiment, the reference-initiated sequential sensing technique uses the first memory element in a sequence as a reference, i.e. the first memory element is used to determine a decision threshold. This decision threshold is used when determining the stored data values in all the memory elements of the sequence (including the first). The sequence length may vary from as little as two to as many as several times the number of memory elements in a column or row. The sequence may "wrap around" from one edge of the array to an adjacent column or row on the opposite edge, but preferably the physical separation between the first memory element and the subsequent memory elements is limited so that the first memory element is fairly representative of the subsequent memory elements.

Figure 5:
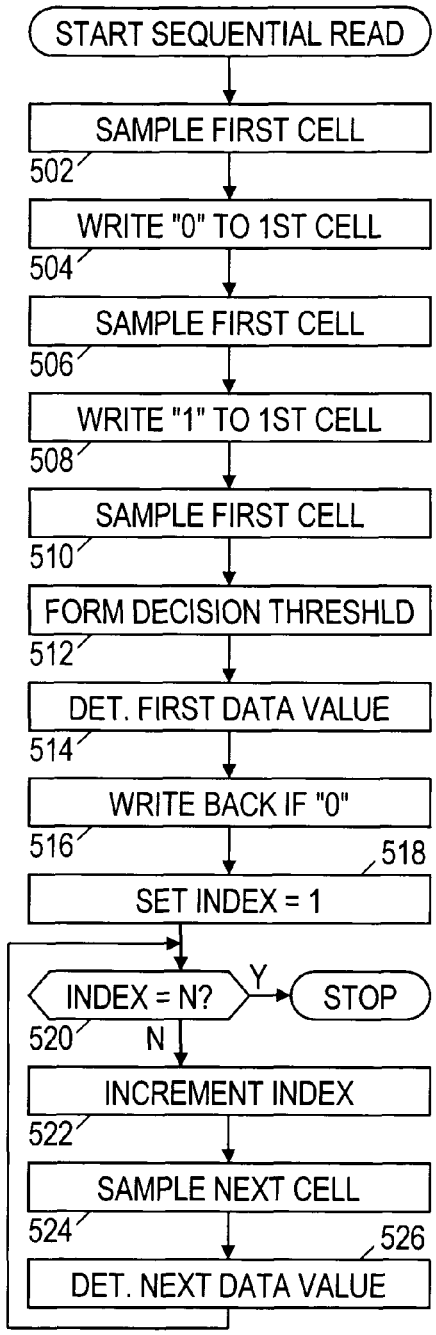
FIGS. 5 and 6 are exemplary flow diagrams in accordance with various disclosed embodiments.

FIG. 5 is a flow diagram that may show the architecture, functionality, and operation of possible implementations of the sense amplifiers. In this regard, each block may represent a module, segment, or portion of software (or firmware) code, which comprises one or more executable instructions for implementing the specified logical function(s). More likely, however, these flow diagrams may be implemented in hardware to support the desired data rates. The hardware implementation may take the form of a hardware state machine. In some alternative implementations, the functions noted in the blocks may occur out of the order noted. For example, the two blocks 502 and 504 shown in succession in FIG. 5 may in fact be executed substantially concurrently or blocks 504 and 508 may sometimes be executed in the reverse order. Further, blocks may be omitted and additional blocks may be added without departing from the scope of the invention.

In one embodiment, a reference-initiated sequential read begins in block 502 with a sense amplifier sampling the contents of a first memory element. The sense amplifier preferably makes a digital measurement of a current, voltage, resistance or time value that represents the logical state of the first memory element. This digital value is preferably stored in a register for later use. In block 504 the sense amplifier waits while a write driver stores a first logical state (e.g., a digital "0") to the first memory element. In block 506 the sense amplifier again samples the contents of the first memory element. The digital measurement made at this time is known to correspond to, e.g., a digital "0," and may be stored in another register for later use. In block 508, the sense amplifier waits while a write driver stores a second logical state (e.g., a digital "1") to the first memory element. In block 510 the sense amplifier once more samples the contents of the first memory element. The digital measurement made at this time is known to correspond to, e.g., a digital "1."

In block 512 the sense amplifier determines a decision threshold. In one embodiment, this determination may be done by averaging the measurements corresponding to the known digital values. In alternative embodiments, various clocked-counter techniques may be used to determine a difference between the measurement corresponding to the known digital values and to add or subtract half this difference to one of the measurements. Examples of such techniques may be found in U.S. Pat. No. 6,188,615 ("MRAM Device Including Digital Sense Amplifiers"). A number of suitable decision threshold determination techniques will be evident to one of ordinary skill in the art.

In block 514, the sense amplifier compares the original measurement of the first memory element to the decision threshold to determine the original data value. At this time, this data value may be provided as output from the sense amplifier. In block 516, the sense amplifier determines if the original data value is different than the value currently stored in the first memory element, and if so, the sense amplifier waits while the write driver stores the correct value in the first memory cell.

In block 518 a loop index may be initialized. In block 520, the sense amplifier determines whether the contents of the last memory element in the sequential read have been determined. (The number of memory elements N in each sequential read may be predetermined by the design of the memory device). If so, the sequential read process halts. Otherwise, in block 522 the loop index is incremented.

In block 524 the sense amplifier samples the contents of the next memory element in the sequence. In block 526 the sense amplifier may compare the measurement to the decision threshold to determine the data value stored in that memory element. The sense amplifier then repeats the loop beginning with block 520.

Figure 6:
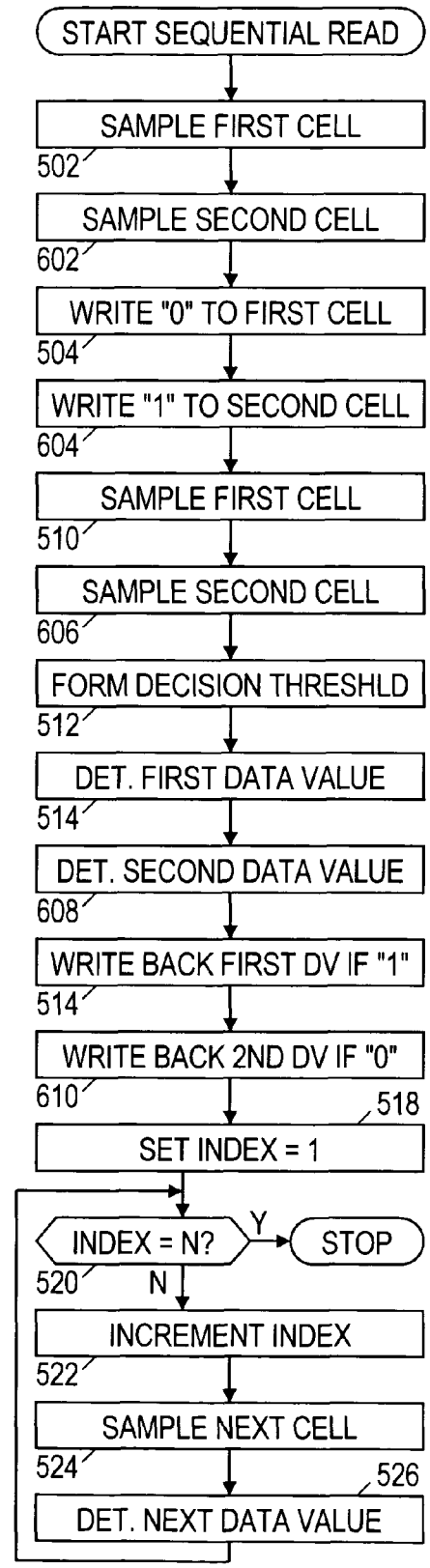

FIG. 6 shows a flow diagram of an alternative implementation. Those blocks that are shared between FIGS. 5 and 6 are numbered identically. In the implementation of FIG. 6, the first two memory elements in a sequential read are used as reference elements. Beginning in block 502 the sense amplifier samples the contents of the first memory element, and preferably stores a digital measurement in a register for later use. In block 602 the sense amplifier samples the contents of the second memory element and preferably stores a second digital measurement in another register for later use. In block 504 the sense amplifier waits while a write driver stores a predetermined logic value (e.g. a digital "0") in the first memory element, and in block 604 the sense amplifier waits while a write driver stores another predetermined logic value (e.g. a digital "1") in the second memory element.

In block 510 the sense amplifier samples the contents of the first memory element, and in block 606 the sense amplifier samples the contents of the second memory element. In block 514 the sense amplifier may determine a decision threshold from these digital measurements. In blocks 514 and 608 the sense amplifier may compare the original measurements of the first and second memory elements to the decision threshold to determine the original data values of these memory elements. In block 514 the sense amplifier determines whether the original data value is different than the current data value and if so, waits while a write driver restores the original data value to the first memory element. Similarly in block 610 the sense amplifier waits if necessary for a write driver to restore the second memory element to its original condition. Thereafter, the sequential read process proceeds as before.

In both embodiments described above, the sequential read process proceeds quickly once the decision threshold has been determined. This may effectively mitigate any delays caused by the number of operations needed to determine the decision threshold at the beginning of each sequential read. Although the number of operations to determine a decision threshold is greater in FIG. 6 than in FIG. 5, there may be a greater opportunity for concurrency. For example, the write operations of blocks 504 and 604 may be performed concurrently, as may the operations of blocks 514 and 610 (if needed). The use of concurrency may actually allow the sequential read process of FIG. 6 to outperform that of FIG. 5.

Thus a memory device having a reference-initiated sequential read process has been described. The described processes may combine the best aspects of both destructive and non-destructive read processes to increase the speed and reliability of memory devices without requiring additional space in the memory array. While the process may have been described in the context of an assisted magnetic memory, the claims are not limited to such a context. To the contrary, the claims encompass non-assisted memory devices and other memory technologies.

The above discussion is only meant to be illustrative of the principles and various embodiments of the present invention. Numerous variations and modifications will become apparent to those skilled in the art once the above disclosure is fully appreciated. For example, the sequential read process may begin with memory cells that are reserved for storing known values, e.g., the first and second rows in each column of the memory array which may be reserved for storing known "0" and "1" values, respectively. This variation trades extra area consumed by reference cells for a time savings in the sequential read operation. The time savings results from eliminating the intermixed write operations from the read operations.

It is intended that the following claims be interpreted to embrace all such variations and modifications.

What is claimed is:

1. A reference-initiated sequential read method that comprises:
   forming a first attribute measurement associated with a stored data value in a first memory element;
   using the first memory element to determine a decision threshold;
   comparing the first attribute measurement to the decision threshold to determine said stored data value in the first memory element;
   forming a subsequent attribute measurement associated with a stored data value in a subsequent memory element; and
   comparing the subsequent attribute measurement to the decision threshold to determine the stored data value in the subsequent memory element.

2. The method of claim 1, wherein said using the first memory element to determine the decision threshold comprises:
   writing a predetermined data value to the first memory element; and
   measuring an attribute associated with the predetermined data value in the first memory element.

3. The method of claim 2, wherein said using the first memory element to determine the decision threshold further comprises:
   writing a second predetermined data value to the first memory element; and
   measuring an attribute associated with the second predetermined data value in the first memory element.

4. The method of claim 3, wherein said using the first memory element to determine the decision threshold further comprises:
   averaging attribute measurements associated with the first end second predetermined data values in the first memory element.

5. The method of claim 2, further comprising:
   forming a second attribute measurement associated with a stored data value in a second memory element; and
   using the second memory element in conjunction with the first memory element to determine the decision threshold.

6. The method of claim 5, wherein said using the second memory element to determine the decision threshold comprises:
   writing a second predetermined data value to the second memory element; and
   measuring an attribute associated with the second predetermined data value in the second memory element.

7. The method of claim 1, further comprising:
   after determining the decision threshold, forming a sequence of attribute measurements associated with a corresponding sequence of memory elements; and
   comparing the attribute measurements to the decision threshold to determine stored data values in the sequence of memory elements.

8. The method of claim 7, wherein the first memory element and the sequence of memory elements are adjacent and aligned along a column or row in a memory array.

9. A memory that comprises:
   a plurality of adjacent memory elements;

a write driver coupled to the first memory element and configured to store at least one predetermined value in a first memory element; and sense amplifier coupled to the plurality of memory elements, wherein the sense amplifier is configured to sequentially determine data values stored in the plurality of adjacent memory elements after using the first memory element to determine a decision threshold, wherein the sense amplifier uses a measurement of an attribute associated with the predetermined value to determine the decision threshold.

10. The memory of claim 9, wherein the decision threshold is used unchanged to determine the data values in each of the plurality of adjacent memory elements.

11. The memory of claim 9, wherein the plurality of adjacent memory elements are aligned along a column.

12. The memory of claim 9, wherein the sense amplifier is configured to re-determine a decision threshold as part of determining data in each of multiple different pluralities of adjacent memory elements.

13. The memory of claim 9, wherein the memory further comprises:
a read buffer coupled to the sense amplifier and configured to buffer a sector of read data.

14. The memory of claim 9, wherein the memory further comprises:
a error correction code (ECC) decoder coupled to the sense amplifier and configured to perform error correction on data values received from the sense amplifier.

15. A memory that comprises:
a plurality of adjacent memory elements; and
sense amplifier coupled to the plurality of memory elements,
wherein the sense amplifier is configured to sequentially determine data values stored in the plurality of adjacent memory elements after using a first memory element to determine a decision threshold,
wherein the sense amplifier also uses a second memory element in the plurality of adjacent memory elements to determine the decision threshold.

16. A digital device that comprises:
a memory means for storing data sectors; and
a sensing means for sequentially retrieving data sectors from the data memory means,
wherein as a part of retrieving each data sector the sensing means determines a decision threshold using multiple portions of the data sector.

17. The digital device of claim 16, wherein the sensing means uses the decision threshold unchanged as the sensing means retrieves a data sector.

18. The digital device of claim 16, wherein the data sectors are stored along columns in the memory means.

19. The digital device of claim 16, further comprising:
a write means for storing at least one predetermined data value in said portion of the memory means.

20. A reference-initiated sequential read process that comprises:
forming a first attribute measurement associated with a known data value in a first reference memory element;
forming a second attribute measurement associated with a known data value in a second reference memory element;
combining the first and second attribute measurements to determine a decision threshold;
forming a subsequent attribute measurement associated with a stored data value in a subsequent memory element; and
comparing the subsequent attribute measurement to the decision threshold to determine the stored data value in the subsequent memory element.

21. The method of claim 20, wherein said combining attribute measurements comprises averaging the attribute measurements.

* * * * *